(12) United States Patent
Chou et al.

(10) Patent No.: US 12,094,894 B2
(45) Date of Patent: *Sep. 17, 2024

(54) IMAGING DEVICE

(71) Applicant: TAIWAN SEMICONDUCTOR MANUFACTURING COMPANY LTD., Hsinchu (TW)

(72) Inventors: Kuo-Yu Chou, Hsinchu (TW); Shang-Fu Yeh, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/350,153

(22) Filed: Jul. 11, 2023

(65) Prior Publication Data

US 2023/0352499 A1 Nov. 2, 2023

Related U.S. Application Data

(63) Continuation of application No. 17/098,963, filed on Nov. 16, 2020, now Pat. No. 11,705,466, which is a continuation of application No. 14/963,160, filed on Dec. 8, 2015, now Pat. No. 10,840,281.

(51) Int. Cl.
*H01L 27/146* (2006.01)

(52) U.S. Cl.
CPC .............. *H01L 27/14609* (2013.01)

(58) Field of Classification Search
CPC .................................. H01L 27/14609
See application file for complete search history.

(56) References Cited

U.S. PATENT DOCUMENTS

| | | | |
|---|---|---|---|
| 4,796,211 A | 1/1989 | Yokouchi et al. | |
| 7,518,646 B2 | 4/2009 | Zarnowski et al. | |
| 8,330,743 B2 | 12/2012 | Tasher et al. | |
| 9,521,337 B1 | 12/2016 | Shen et al. | |
| 10,840,281 B2 | 11/2020 | Chou et al. | |
| 11,705,466 B2 * | 7/2023 | Chou ............... | H01L 27/14609 250/206 |
| 2005/0012511 A1 | 1/2005 | Wu | |
| 2009/0086067 A1 | 4/2009 | Araki et al. | |
| 2011/0115526 A1 | 5/2011 | Ouchi | |
| 2017/0269237 A1 | 9/2017 | Cao et al. | |

OTHER PUBLICATIONS

Office Action dated Aug. 14, 2020 from corresponding application No. TW 105138292.
Office Action dated Jun. 17, 2020 from corresponding application No. TW 105138292.

* cited by examiner

*Primary Examiner* — Georgia Y Epps
*Assistant Examiner* — Don J Williams
(74) *Attorney, Agent, or Firm* — Hautpman Ham, LLP

(57) ABSTRACT

An integrated circuit includes a ramp signal generator circuit, a comparator, a counter and a control circuit. The ramp signal generator circuit is configured to generate a ramp reference signal. The comparator configured to compare a pixel output signal and the ramp reference signal thereby generating a comparator output signal. The counter is coupled to the comparator, and configured to be enabled or disabled in response to the comparator output signal. The control circuit coupled to the comparator, and configured to enable or disable the comparator by a first enable signal, the first enable signal generated in response to at least the comparator output signal.

20 Claims, 5 Drawing Sheets

IMAGING DEVICE

PRIORITY CLAIM

The present application is a continuation of U.S. application Ser. No. 17/098,963, filed Nov. 16, 2020, now U.S. Pat. No. 11,705,466, issued Jul. 18, 2023, which is a continuation of U.S. application Ser. No. 14/963,160, filed Dec. 8, 2015, now U.S. Pat. No. 10,840,281, issued Nov. 17, 2020, which are herein incorporated by reference in their entireties.

BACKGROUND

Imaging devices include, for example, complementary metal-oxide semiconductor (CMOS) image sensors. In some approaches, an imaging device includes an array of pixels arranged in rows and columns, and an analog-to-digital converter (ADC). Each one of the pixels contains a photosensitive element. Each photosensitive element produces charge that is proportional to intensity of light which the photosensitive element receives. Each one of the pixels generates an analog pixel output signal accordingly. The analog-to-digital converter then converts the analog pixel output signal to a digital signal, in order for subsequent imaging operation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
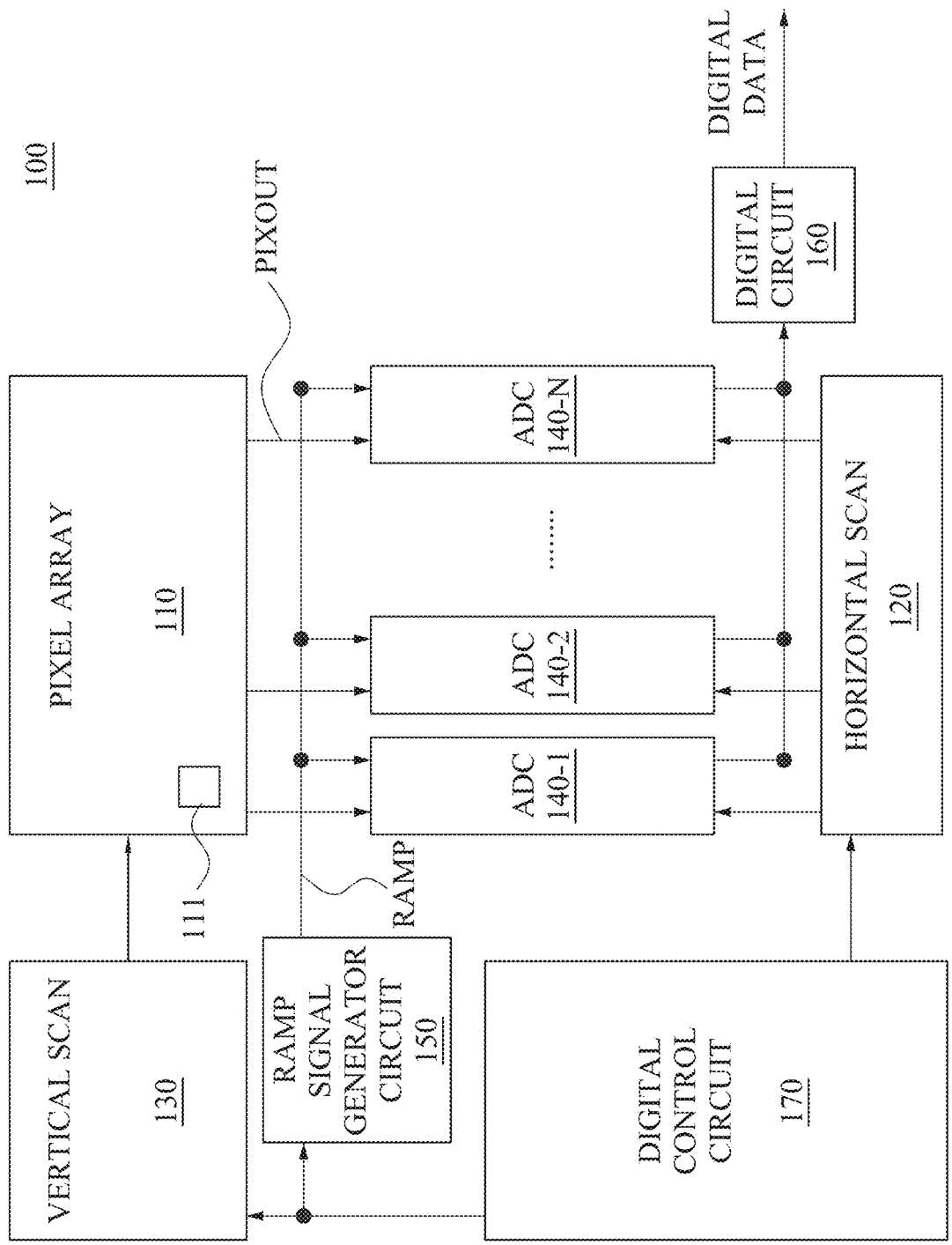
FIG. 1 is a schematic diagram of an imaging device 100 in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used in this document to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

FIG. 1 is a schematic diagram of an imaging device 100 in accordance with some embodiments of the present disclosure. In some embodiments, the imaging device 100 is implemented in a complementary metal-oxide semiconductor (CMOS) image sensor or implemented as a CMOS image sensor. Various devices which require implementation of the imaging device 100 are within the contemplated scope of the present disclosure.

For illustration in FIG. 1, the imaging device 100 includes a pixel array 110, a horizontal scan circuit 120, and a vertical scan circuit 130. The pixel array 110 includes pixel units 111, which, in some embodiments, are arranged in rows and columns. For simplicity, one pixel unit 111 is shown and given for illustration in FIG. 1. The horizontal scan circuit 120 is configured to select a particular column of pixel units 111 in the pixel array 110. The vertical scan circuit 130 is configured to select a particular row of pixel units 111 in the pixel array 110.

Embodiments illustrated with reference to "rows" and "columns" of the pixel array 110 are given for illustration. It is appreciated that rows and columns in the pixel array 110 do not necessarily denote any particular direction or orientation of the pixel array 110.

In some embodiments, the imaging device 100 further includes analog-to-digital converter (ADC) circuits, labeled 140-1, 140-2, . . . , 140-N, respectively, where "N" indicates the number of columns in the pixel array 110. For illustration, the analog-to-digital converter circuits 140-1, 140-2, . . . , 140-N are each operated as a column analog-to-digital converter circuit corresponding to an associated column of pixel units 111 in the pixel array 110. For simplicity, each one of the analog-to-digital converter circuits 140-1, 140-2, . . . , 140-N is referenced as 140 hereinafter for illustration, because each one of the analog-to-digital converter circuits 140-1, 140-2, . . . , 140-N operates in a similar way in some embodiments.

Each one of the analog-to-digital converter circuits 140 receives an analog pixel output signal PIXOUT from one pixel unit 111 in the corresponding column in the pixel array 110, as selected by the vertical scan circuit 130. Furthermore, each one of the analog-to-digital converter circuits 140 receives a ramp signal RAMP, operating as a reference signal, from a ramp signal generator circuit 150.

The ramp signal generator circuit 150 is controlled by a digital control circuit 170. The ramp signal generator circuit 150 is configured to generate the ramp signal RAMP, when, in some embodiments, a pixel reset signal and a pixel image signal indicated by the analog pixel output signal PIXOUT are read. The ramp signal generator circuit 150 supplies the ramp signal RAMP as a reference signal to the analog-to-digital converter circuits 140. For illustration, in some embodiments, the ramp signal generator circuit 150 generates the ramp signal RAMP for reset. Each one of the analog-to-digital converter circuits 140 compares the pixel reset signal with the ramp signal RAMP for reset. In some other embodiments, when the pixel image signal indicated by the analog pixel output signal PIXOUT is read, each one of the analog-to-digital converter circuits 140 compares the pixel image signal with the ramp signal RAMP. In some embodiments, the ramp signal generator circuit 150 is implemented by a digital-to-analog converter (DAC) circuit.

Digital control circuit 170 controls operations of the horizontal scan circuit 120, the vertical scan circuit 130, each one of the analog-to-digital converter circuits 140 (only one control line shown in FIG. 1 for simplicity), and the ramp signal generator circuit 150. Moreover, output of each one of the analog-to-digital converter circuits 140 is supplied to a digital circuit 160. The digital circuit 160 outputs a digital data signal that is representative of the analog pixel output signal PIXOUT.

Figure 2:
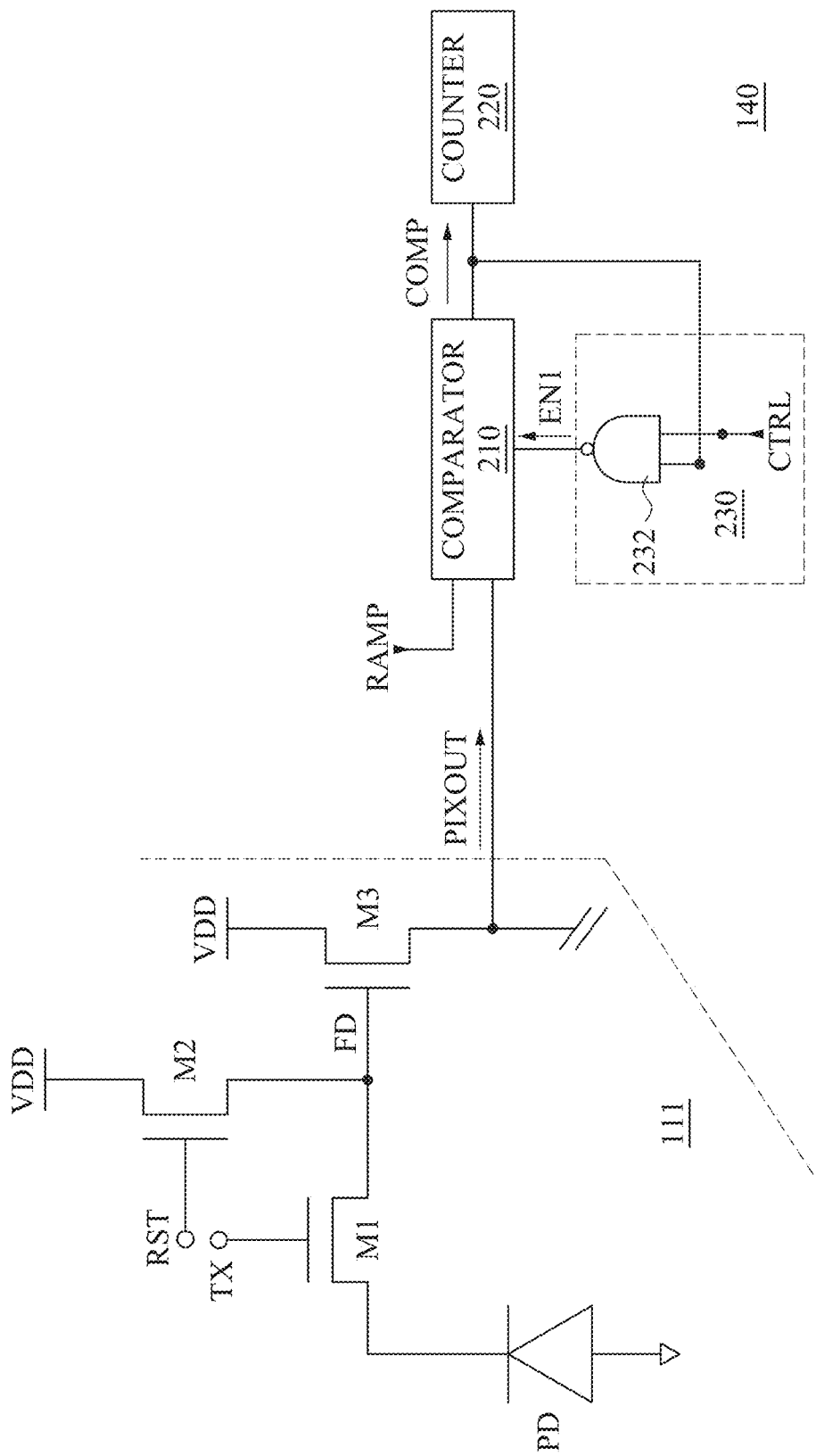
FIG. 2 is a schematic diagram of the analog-to-digital converter circuit 140 associated with the pixel unit 111 in FIG. 1, in accordance with some embodiments of the present disclosure.

FIG. 2 is a schematic diagram of the analog-to-digital converter circuit 140 associated with the pixel unit 111 in FIG. 1, in accordance with some embodiments of the present disclosure.

In some embodiments, the pixel unit 111 includes a photodiode PD and transistors M1-M3 which are, in further embodiments, NMOS transistors, as illustrated in FIG. 2.

For illustration in FIG. 2, an anode of the photodiode PD is, for example, grounded, and a cathode of the photodiode PD is coupled to the transistor M1. The photodiode PD is configured to output an analog signal in response to receiving incident light.

A gate of the transistor M1 is configured to receive a read signal TX from the vertical scan circuit 130 in FIG. 1. A drain of the transistor M1 is coupled to a node FD, and a source of the transistor M1 is coupled to the photodiode PD. When turned on by the read signal TX, the transistor M1 functions as a signal transfer transistor, to transfer the analog signal from the photodiode PD.

A gate of the transistor M2 is configured to receive a reset signal RST from the vertical scan circuit 130 in FIG. 1. A drain of the transistor M2 is supplied with a supply voltage VDD, and a source of the transistor M2 is coupled to the node FD. When turned on by the reset signal RST, the transistor M2 functions as a reset transistor, to set the node FD to a reset voltage given as a reference voltage of an image signal read from the photodiode PD.

A gate of the transistor M3 is coupled to the node FD. A drain of the transistor M3 is supplied with the supply voltage VDD. A source of the transistor M3 is coupled to the corresponding analog-to-digital converter circuit 140. The transistor M3 functions as a source follower transistor, or an amplification transistor, which amplifies a voltage at the node FD and outputs the analog pixel output signal PIXOUT to the corresponding analog-to-digital converter circuit 140.

The number and arrangement of transistors shown in FIG. 2 are given for illustrative purposes. Various numbers and arrangements of transistors to implement the pixel unit 111 in FIG. 2 are within the contemplated scope of the present disclosure. For example, in some embodiments, the pixel unit 111 further includes a transistor (not shown in FIG. 2) which is coupled to the source of the transistor M3 and functions as a select transistor, in order to selectively transmit the analog pixel output signal PIXOUT to the corresponding analog-to-digital converter circuit 140.

Moreover for illustration in FIG. 2, the analog-to-digital converter circuit 140 includes a comparator 210 and a counter 220. One input of the comparator 210 is coupled to the corresponding pixel unit 111, to receive the analog pixel output signal PIXOUT. The other input of the comparator 210 is configured to receive the ramp signal RAMP from the ramp signal generator circuit 150 in FIG. 1. The comparator 210 compares the ramp signal RAMP with the analog pixel output signal PIXOUT, to generate a comparator output signal COMP for operatively enabling and disabling the counter 220.

The comparator output signal COMP is further fed back to a control circuit 230. In accordance with the comparator output signal COMP, the control circuit 230 operatively enables and disables the comparator 210.

In some embodiments, the control circuit 230 includes a logic unit including, in various embodiments, a NAND gate 232. The logic unit is configured to perform logic operation of a control signal CTRL and the comparator output signal COMP, to generate an enable signal EN1 for operatively enabling and disabling the comparator 210. For illustration of the NAND gate 232, inputs of the NAND gate 232 are configured to receive the control signal CTRL and the comparator output signal COMP, respectively. An output of the NAND gate 232 is coupled to the comparator 210, and outputs the enable signal EN1.

The configuration of the control circuit 230 or the logic unit therein shown in FIG. 2 is given for illustrative purposes. Various configurations of the control circuit 230 or the logic unit therein in FIG. 2 are within the contemplated scope of the present disclosure. For example, in various embodiments, the control circuit 230 is implemented in the analog-to-digital converter circuit 140. In alternative embodiments, the control circuit 230 is implemented outside the analog-to-digital converter circuit 140.

In addition, the configuration of the analog-to-digital converter circuit 140 shown in FIG. 2 is given for illustrative purposes. Various configurations of the analog-to-digital converter circuit 140 in FIG. 2 are within the contemplated scope of the present disclosure. For example, in various embodiments, the analog-to-digital converter circuit 140 further includes a deglitch circuit (not shown) coupled between the comparator 210 and the counter 220. The deglitch circuit is configured to filter noise in the comparator output signal COMP from the comparator 210.

Figure 3:
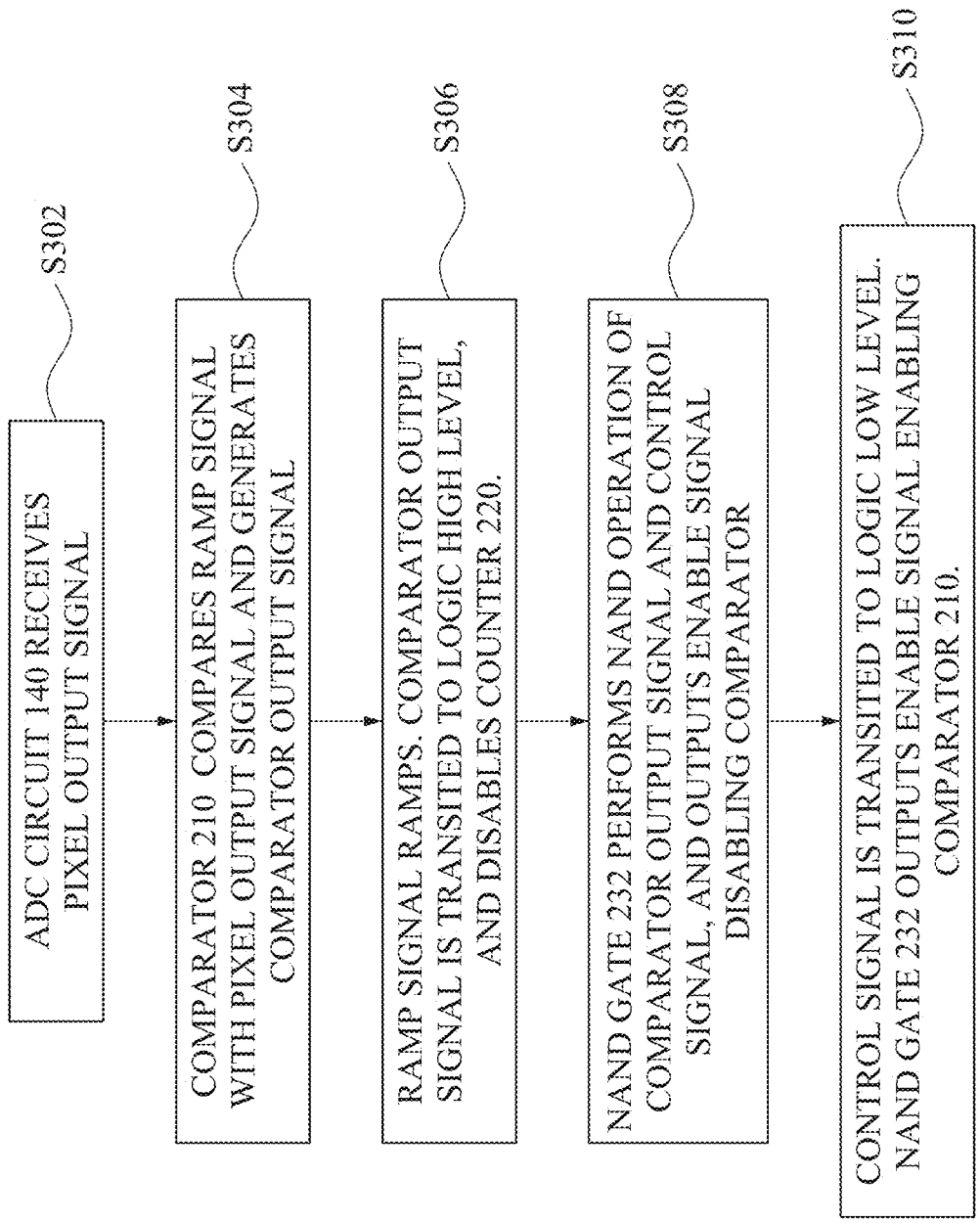
FIG. 3 is a flow chart of a method 300 illustrating operations of the analog-to-digital converter circuit 140 in FIG. 2, in accordance with some embodiments of the present disclosure.

FIG. 3 is a flow chart of a method 300 illustrating operations of the analog-to-digital converter circuit 140 in FIG. 2, in accordance with some embodiments of the present disclosure. Following illustrations of the method 300 in FIG. 3 with reference to the analog-to-digital converter circuit 140 in FIG. 2 include exemplary operations. However, the operations in FIG. 3 are not necessarily performed in the order shown. Alternatively stated, operations may be added, replaced, changed order, and/or eliminated as appropriate, in accordance with the spirit and scope of various embodiments of the present disclosure.

In operation S302, the analog-to-digital converter circuit 140 receives the analog pixel output signal PIXOUT from the pixel unit 111, in order to convert the analog pixel output signal PIXOUT. In some embodiments, the analog pixel output signal PIXOUT indicates a pixel image signal which follows a pixel reset signal.

In operation S304, the comparator 210, which is enabled by the enable signal EN1 having a logic high level, compares the ramp signal RAMP with the analog pixel output signal PIXOUT.

Based on the comparison of the ramp signal RAMP and the analog pixel output signal PIXOUT, the comparator 210 generates the comparator output signal COMP for enabling the counter 220.

In some embodiments, when the voltage of the analog pixel output signal PIXOUT is smaller than the voltage of the ramp signal RAMP, the comparator output signal COMP has a logic low level and enables the counter 220. Effectively, the counter 220 starts a count-up operation when being enabled by the comparator output signal COMP.

In operation S306, the ramp signal RAMP ramps, for example, down from a high value to a low value. When the ramp signal RAMP coincides with the analog pixel output signal PIXOUT, the comparator output signal COMP is transited from a logic low level to a logic high level. The comparator output signal COMP disables the counter 220 accordingly. Effectively, the counter 220 stops the count-up operation when being disabled by the comparator output signal COMP.

Moreover, the counter 220 also generates a digital signal derived from a count value obtained by itself, which corresponds to the comparison of the ramp signal RAMP and the analog pixel output signal PIXOUT. Effectively, the analog pixel output signal PIXOUT is entirely converted, by the analog-to-digital converter circuit 140, to the digital signal generated by the counter 220. Alternatively stated, the analog-to-digital converter circuit 140 finishes converting the analog pixel output signal PIXOUT to the digital signal.

In operation S308, the NAND gate 232 performs NAND operation of the comparator output signal COMP having a logic high level, and the control signal CTRL having a logic high level. Accordingly, the NAND gate 232 outputs the enable signal EN1 having a logic low level. The comparator 210 is thus disabled by the enable signal EN1 having the logic low level. Effectively, power consumption of the comparator 210 is reduced. As a result, power consumption of the analog-to-digital converter circuit 140 is reduced, after the analog-to-digital converter circuit 140 finishes converting the analog pixel output signal PIXOUT to the digital signal.

Afterwards, in operation S310, the control signal CTRL is transited from a logic high level to a logic low level. In such a condition, the analog-to-digital converter circuit 140 is reset and ready to convert a next analog pixel output signal PIXOUT which, in some embodiments, indicates a next pixel image signal. The NAND gate 232 performs NAND operation of the comparator output signal COMP having a logic high level, and the control signal CTRL having a logic low level. Accordingly, the NAND gate 232 outputs the enable signal EN1 having a logic high level. The comparator 210 is thus enabled again by the enable signal EN1 having the logic high level. As a result, operations similar to operations S302, S304, S306, and S308 are able to be performed, for the conversion of the next analog pixel output signal PIXOUT.

The logic levels of the signals illustrated in FIG. 2 are given for illustrative purposes. Various logic levels of the signals illustrated in FIG. 2 are within the contemplated scope of the present disclosure.

Figure 4:
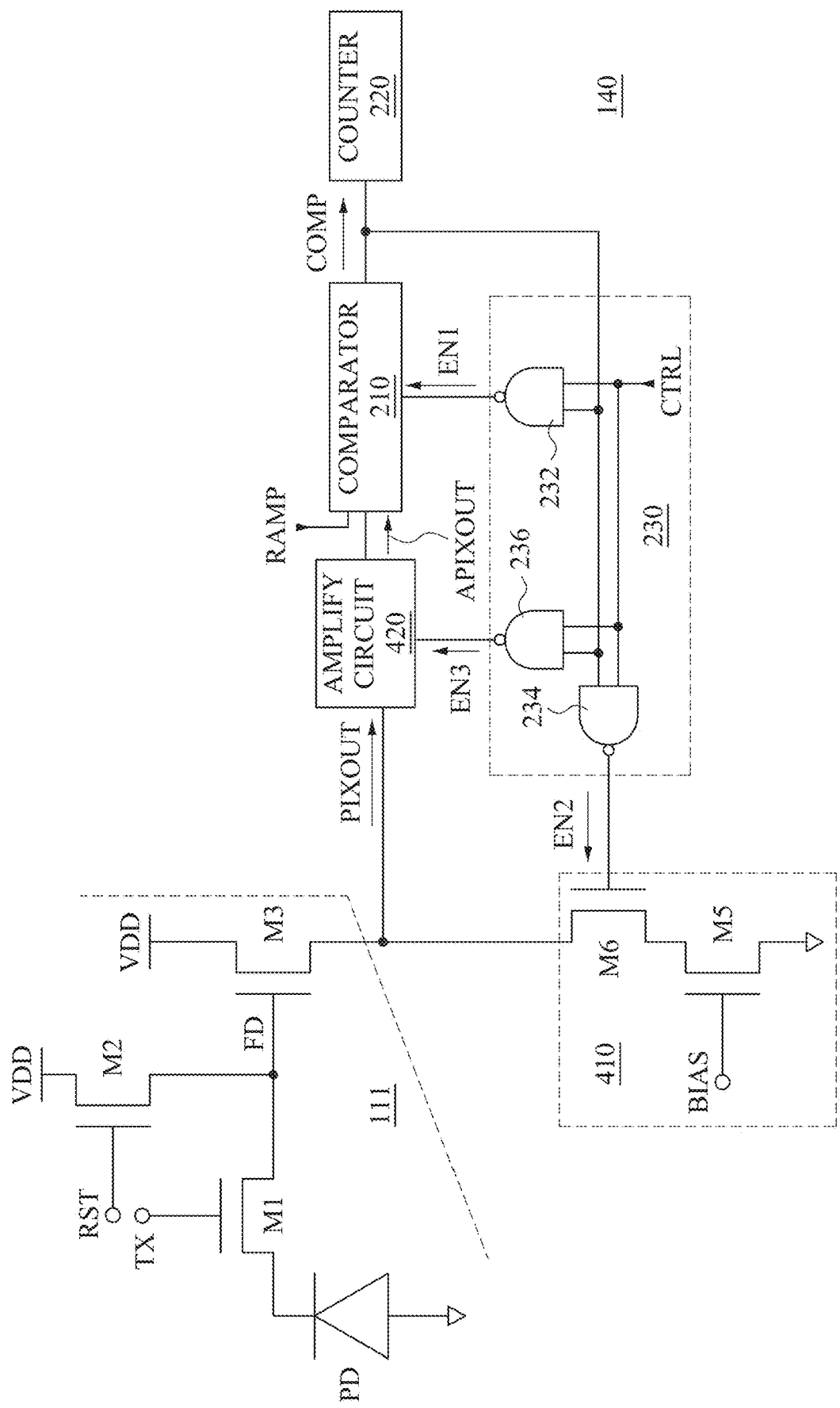
FIG. 4 is a schematic diagram of the analog-to-digital converter circuit 140 associated with the pixel unit 111 in FIG. 1, in accordance with various embodiments of the present disclosure.

FIG. 4 is a schematic diagram of the analog-to-digital converter circuit 140 associated with the pixel unit 111 in FIG. 1, in accordance with various embodiments of the present disclosure. With respect to the embodiments of FIG. 2, like elements in FIG. 4 are designated with the same reference numbers for ease of understanding.

Compared to the embodiments illustrated in FIG. 2, the pixel unit 111 is further coupled to a pixel bias circuit 410. In some embodiments, the pixel unit 111 is directly coupled to the pixel bias circuit 410, and in some other embodiments, the pixel unit 111 is indirectly coupled to the pixel bias circuit 410. The pixel bias circuit 410 functions as a current sink and provides bias current for the pixel unit 111. As illustratively shown in FIG. 4, the pixel bias circuit 410 is further coupled to the control circuit 230 and controlled by the control circuit 230.

In some embodiments, the pixel bias circuit 410 includes transistors M5 and M6 which, in further embodiments, are NMOS transistors. For illustration, a gate of the transistor M5 is configured to receive a bias signal BIAS, and a source of the transistor M5 is, for example, grounded. On the other hand, a gate of the transistor M6 is coupled to the control circuit 230. A drain of the transistor M6 is coupled to, for example, the transistor M3 in the pixel unit 111, and a source of the transistor M6 is coupled to the drain of the transistor M5.

For illustration, the transistor M5 is biased with the bias signal BIAS to turn on. The transistor M6 is operatively turned on and turned off by an enable signal EN2 generated from the control circuit 230. When the transistor M6 is turned on by the enable signal EN2, bias current is generated from the pixel bias circuit 410, and the pixel unit 111 is supplied with the bias current. Effectively, the pixel bias circuit 410 functions as a current sink.

The configuration of the pixel bias circuit 410 is given for illustrative purposes. Various configurations of the pixel bias circuit 410 are within the contemplated scope of the present disclosure.

Moreover, the arrangement of the pixel bias circuit 410 is given for illustrative purposes. Various arrangements of the pixel bias circuit 410 are within the contemplated scope of the present disclosure. For example, in some embodiments, the pixel bias circuit 410 is arranged outside the pixel unit 111; in some other embodiments, the pixel bias circuit 410 is independently arranged and separate from the analog-to-digital converter circuit 140.

Compared to the embodiments illustrated in FIG. 2, the analog-to-digital converter circuit 140 in FIG. 4 further includes an amplify circuit 420, in some embodiments. The amplify circuit 420 is coupled between the pixel unit 111 and the comparator 210, and controlled by the control circuit 230. The amplify circuit 420 is configured to amplify the analog pixel output signal PIXOUT, and accordingly generate an amplified pixel output signal APIXOUT to be compared with the ramp signal RAMP.

For illustration, the amplify circuit 420 is enabled by an enable signal EN3 generated from the control circuit 230. When the amplify circuit 420 is enabled, the amplify circuit 420 amplifies the analog pixel output signal PIXOUT, to output the amplified pixel output signal APIXOUT to the comparator 210.

Compared to the embodiments illustrated in FIG. 2, the control circuit 230 in FIG. 4 further includes an additional logic unit including, in various embodiments, a NAND gate 234 and/or a NAND gate 236. The additional logic unit is configured to perform logic operation of the control signal CTRL and the comparator output signal COMP. The additional logic unit accordingly generates the enable signal EN2 for operatively enabling and disabling the pixel bias circuit 410, and the enable signal EN3 for operatively enabling and disabling the amplify circuit 420.

For illustration of the NAND gate 234, inputs of the NAND gate 234 are configured to receive the control signal CTRL and the comparator output signal COMP, respectively. An output of the NAND gate 234 is coupled to the gate of the transistor M6 in the pixel bias circuit 410, and outputs the enable signal EN2.

For illustration of the NAND gate 236, inputs of the NAND gate 236 are configured to receive the control signal CTRL and the comparator output signal COMP, respectively. An output of the NAND gate 236 is coupled to the amplify circuit 420, and outputs the enable signal EN3.

For the embodiments illustrated in FIG. 4, additional operations with respect to the method 300 illustrated in FIG. 3 are performed. For illustration, in operation S308 in FIG. 3, the NAND gate 234 performs NAND operation of the comparator output signal COMP having a logic high level, and the control signal CTRL having a logic high level. Accordingly, the NAND gate 234 outputs the enable signal EN2 having a logic low level.

The transistor M6 is turned off by the enable signal EN2 having the logic low level. The pixel bias circuit 410 is thus disabled by the enable signal EN2 having the logic low level.

Effectively, power consumption of the comparator 210 is reduced. As a result, power consumption of the analog-to-digital converter circuit 140 is further reduced, after the analog-to-digital converter circuit 140 finishes converting the analog pixel output signal PIXOUT to the digital signal.

Afterwards, when the control signal CTRL is transited from a logic high level to a logic low level, the NAND gate 234 outputs the enable signal EN2 having a logic high level. The transistor M6 is thus turned on again by the enable signal EN2 having the logic high level. Alternatively stated, the pixel bias circuit 410 is thus enabled again by the enable signal EN2 having a logic high level.

Furthermore, in operation S308 in FIG. 3, the NAND gate 236 performs NAND operation of the comparator output signal COMP having a logic high level, and the control signal CTRL having a logic high level. Accordingly, the NAND gate 236 outputs the enable signal EN3 having a logic low level.

The amplify circuit 420 is thus disabled by the enable signal EN3 having the logic low level. Effectively, power consumption of the amplify circuit 420 is reduced. As a result, power consumption of the analog-to-digital converter circuit 140 is further reduced, after the analog-to-digital converter circuit 140 finishes converting the analog pixel output signal PIXOUT to the digital signal.

Afterwards, when the control signal CTRL is transited from a logic high level to a logic low level, the NAND gate 236 outputs the enable signal EN3 having a logic high level. The amplify circuit 420 is thus enabled again by the enable signal EN3 having a logic high level.

The logic levels of the signals illustrated in FIG. 4 are given for illustrative purposes. Various logic levels of the signals illustrated in FIG. 4 are within the contemplated scope of the present disclosure.

The configuration of the analog-to-digital converter circuit 140 shown in FIG. 4 is given for illustrative purposes. Various configurations of the analog-to-digital converter circuit 140 in FIG. 4 are within the contemplated scope of the present disclosure. For example, in various embodiments, the pixel bias circuit 410 is included while the analog-to-digital converter circuit 140 does not include the amplify circuit 420. In alternative embodiments, the pixel bias circuit 410 is not included while the analog-to-digital converter circuit 140 includes the amplify circuit 420.

Furthermore, the configuration of the control circuit 230 in FIG. 4 is given for illustrative purposes. Various configurations of the control circuit 230 in FIG. 4 are within the contemplated scope of the present disclosure. For example, in various embodiments employing the pixel bias circuit 410 without the amplify circuit 420, the control circuit 230 includes the NAND gate 234 without the NAND gate 236. In alternative embodiments employing the amplify circuit 420 without the pixel bias circuit 410, the control circuit 230 includes the NAND gate 236 without the NAND gate 234.

Explained in a different way, when the analog pixel output signal PIXOUT is entirely converted to the digital signal, the control circuit 230 disables at least one of circuits and/or devices, which still consumes power. Effectively, power consumption is reduced when the analog-to-digital conversion is not performed.

Figures 5A, 5B:
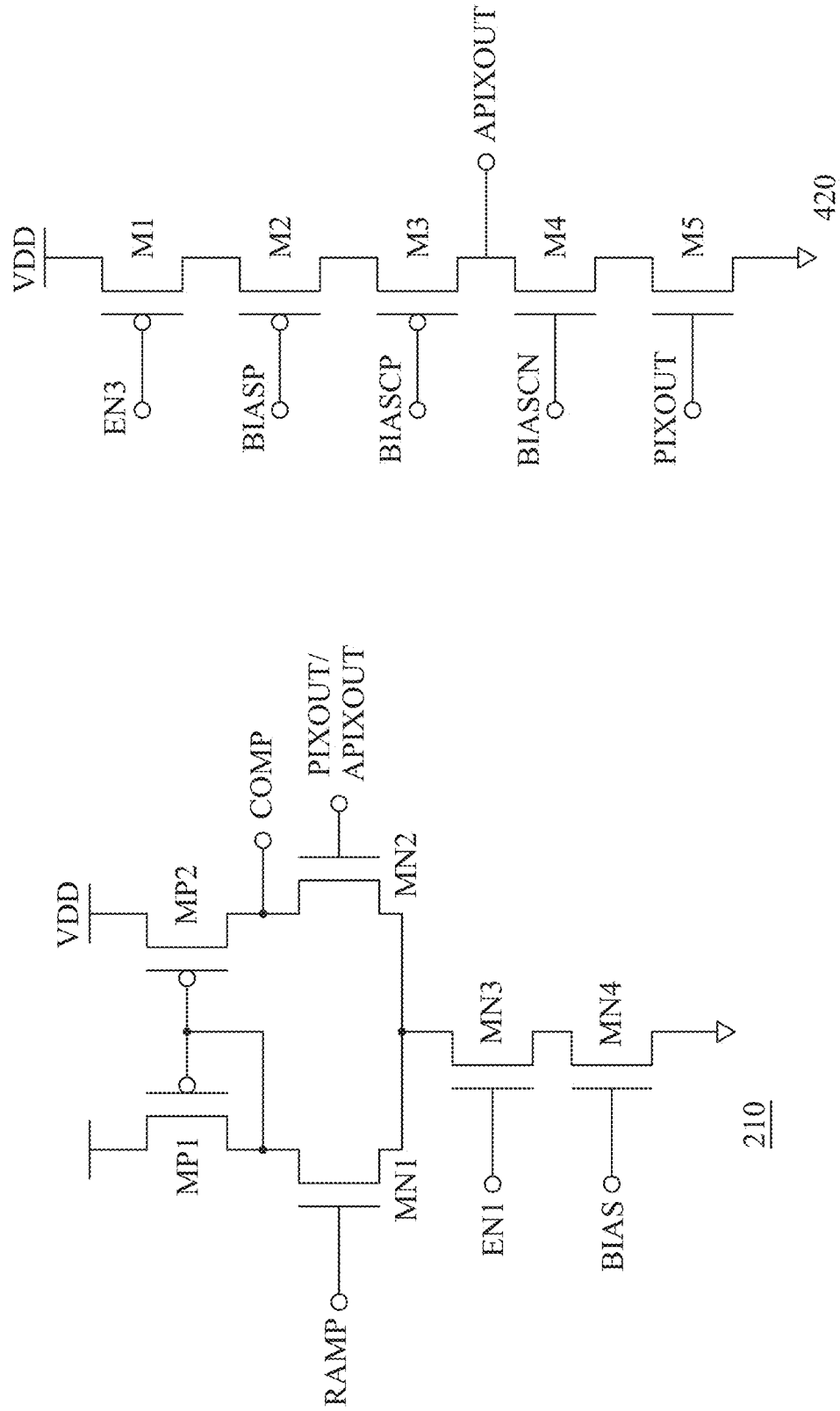
FIG. 5A is a circuit diagram of the comparator 210 in FIG. 2 or FIG. 4, in accordance with some embodiments of the present disclosure.
FIG. 5B is a circuit diagram of the amplify circuit 420 in FIG. 4, in accordance with some embodiments of the present disclosure.

FIG. 5A is a circuit diagram of the comparator 210 in FIG. 2 or FIG. 4, in accordance with some embodiments of the present disclosure. For illustration in FIG. 5A, the comparator 210 includes transistors MP1-MP2 which, in some embodiments, are PMOS transistors, and transistors MN1-MN4 which, in some embodiments, are NMOS transistors. The transistors MP1-MP2 and MN1-MN4 are coupled as illustrated in FIG. 5A.

The transistors MN1 and MN2 are configured to receive the ramp signal RAMP and the analog pixel output signal PIXOUT as illustrated in FIG. 2, or the amplified pixel output signal APIXOUT as illustrated in FIG. 4, respectively. The transistor MN3 is configured to receive the enable signal EN1. The transistor MN4 is configured to be biased with a bias signal BIAS.

The transistor MN3 functions as an enable transistor. When the enable signal EN1 has a logic high level, the transistor MN3 is turned on, and the comparator 210 is accordingly enabled. Alternatively, when the enable signal EN1 has a logic low level, the transistor MN3 is turned off, and the comparator 210 is accordingly disabled.

FIG. 5B is a circuit diagram of the amplify circuit 420 in FIG. 4, in accordance with some embodiments of the present disclosure. For illustration in FIG. 5B, the amplify circuit 420 includes transistors M1-M3 which, in some embodiments, are PMOS transistors, and transistors M4-M5 which, in some embodiments, are NMOS transistors. The transistors M1-M5 are coupled as illustrated in FIG. 5B.

The transistor M2 is configured to be biased with a bias signal BIASP. The transistors M3 and M4 are configured to be biased with bias signals BIASCP and BIASCN, respectively. The transistor M1 is configured to receive the enable signal EN3. The transistor M5 is configured to receive the analog pixel output signal PIXOUT as illustrated in FIG. 4. In some embodiments, the transistors M2 and M3 are biased with a reference voltage, including, for example, ground voltage. In some other embodiments, the transistor M4 is biased with a power voltage, including, for example, the supply voltage VDD.

The transistor M1 functions as an enable transistor. When the enable signal EN3 has a logic low level, the transistor M1 is turned on, and the amplify circuit 420 is accordingly enabled. Alternatively, when the enable signal EN3 has a logic high level, the transistor M1 is turned off, and the amplify circuit 420 is accordingly disabled.

The configurations of the comparator 210 illustrated in FIG. 5A and the amplify circuit 420 illustrated in FIG. 5B are given for illustrative purposes. Various configurations of the comparator 210 in FIG. 5A and the amplify circuit 420 in FIG. 5B are within the contemplated scope of the present disclosure.

Moreover, various circuits or devices to implement the transistors in the aforementioned embodiments are within the contemplated scope of the present disclosure.

Furthermore, in some embodiments of this document, at least one of the transistors is implemented with at least one metal oxide semiconductor (MOS) transistor, at least one bipolar junction transistor (BJT), etc., or the combination thereof. Various circuits or devices to implement the transistors in the aforementioned embodiments are within the contemplated scope of the present disclosure.

In this document, the term "coupled" may also be termed as "electrically coupled", and the term "connected" may be termed as "electrically connected". "Coupled" and "connected" may also be used to indicate that two or more elements cooperate or interact with each other.

In some embodiments, an integrated circuit is disclosed that includes a ramp signal generator circuit configured to generate a ramp reference signal. In some embodiments, the integrated circuit further includes a comparator configured to compare a pixel output signal and the ramp reference signal thereby generating a comparator output signal. In some embodiments, the integrated circuit further includes a counter coupled to the comparator, and configured to be enabled or disabled in response to the comparator output signal. In some embodiments, the integrated circuit further includes a control circuit coupled to the comparator, and configured to enable or disable the comparator by a first enable signal, the first enable signal generated in response to at least the comparator output signal.

Also, an integrated circuit is disclosed that includes an analog-to-digital converter circuit configured to convert a first analog pixel output signal to a digital signal. In some embodiments, the analog-to-digital converter circuit includes a comparator configured to generate a comparator output signal in response to a second analog pixel output signal and a reference signal. In some embodiments, the analog-to-digital converter circuit further includes a counter coupled to the comparator, and configured to be enabled or disabled in response to the comparator output signal. In some embodiments, the analog-to-digital converter circuit further includes a control circuit coupled to the comparator, and configured to enable or disable the comparator by a first enable signal, the first enable signal generated in response to at least one of the comparator output signal or a control signal.

Also, a method of operating an analog-to-digital converter circuit is disclosed. In some embodiments, the method includes receiving, by a comparator, a first pixel output signal. In some embodiments, the method further includes comparing, by the comparator, a reference signal with a first pixel output signal thereby generating a comparator output signal. In some embodiments, the method further includes enabling or disabling, by a controller, the comparator by a first enable signal, the first enable signal being generated in response to at least the comparator output signal, the controller being coupled to the comparator.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
   a ramp signal generator circuit configured to generate a ramp reference signal;
   a comparator configured to compare a pixel output signal and the ramp reference signal thereby generating a comparator output signal;
   a counter coupled to the comparator, and configured to be enabled or disabled in response to the comparator output signal; and
   a control circuit coupled to the comparator, and configured to enable or disable the comparator by a first enable signal, the first enable signal generated in response to at least the comparator output signal.

2. The integrated circuit of claim 1, further comprising:
   a pixel circuit coupled to the comparator, and configured to generate the pixel output signal.

3. The integrated circuit of claim 2, further comprising:
   an amplifier coupled to the pixel circuit, the comparator and the control circuit, the amplifier being enabled or disabled by the first enable signal, the amplifier configured to amplify the pixel output signal.

4. The integrated circuit of claim 1, wherein the control circuit comprises:
   a NAND gate comprising a first input terminal coupled to the comparator and configured to receive the comparator output signal, a second input terminal configured to receive a control signal, and a first output terminal coupled to the comparator and configured to generate the first enable signal in response to at least one of the comparator output signal or the control signal.

5. The integrated circuit of claim 1, wherein the comparator comprises:
   a bias transistor having a gate, a drain and a source, the source of the bias transistor being coupled to a reference voltage supply, and the gate of the bias transistor being configured to receive a bias voltage; and
   an enable transistor having a gate, a drain and a source, the source of the enable transistor being coupled to the drain of the bias transistor, the gate of the enable transistor being configured to receive the first enable signal, and the drain of the enable transistor being coupled to at least a first node.

6. The integrated circuit of claim 5, wherein the comparator further comprises:
   a first transistor having a gate, a drain and a source, the source of the first transistor being coupled to a voltage supply; and
   a second transistor having a gate, a drain and a source, each of the gate of the first transistor, the drain of the first transistor and the drain of the second transistor are coupled together, the source of the second transistor being coupled to the first node and the drain of the enable transistor, and the gate of the second transistor being configured to receive the ramp reference signal.

7. The integrated circuit of claim 6, wherein the comparator further comprises:
   a third transistor having a gate, a drain and a source, the source of the third transistor being coupled to the voltage supply, and the gate of the third transistor being coupled to the gate of the first transistor, the drain of the first transistor and the drain of the second transistor; and a fourth transistor having a gate, a drain and a source, the drain of the third transistor being coupled to the drain of the fourth transistor at an output node of the comparator, the source of the fourth transistor being coupled to the first node, the drain of the enable transistor, and the source of the second transistor, and the gate of the fourth transistor being configured to receive the pixel output signal.

8. An integrated circuit comprising:
an analog-to-digital converter circuit configured to convert a first analog pixel output signal to a digital signal, wherein the analog-to-digital converter circuit comprises:
  a comparator configured to generate a comparator output signal in response to a second analog pixel output signal and a reference signal;
  a counter coupled to the comparator, and configured to be enabled or disabled in response to the comparator output signal; and
  a control circuit coupled to the comparator, and configured to enable or disable the comparator by a first enable signal, the first enable signal generated in response to at least one of the comparator output signal or a control signal.

9. The integrated circuit of claim 8, wherein the analog-to-digital converter circuit comprises:
an amplifier coupled to the comparator and the control circuit, the amplifier being enabled or disabled by a second enable signal, the amplifier being configured to generate the second analog pixel output signal in response to the first analog pixel output signal.

10. The integrated circuit of claim 9, further comprising:
a pixel bias circuit coupled to at least one of the amplifier and the control circuit,
wherein the control circuit is further configured to enable or disable the pixel bias circuit in response to a third enable signal.

11. The integrated circuit of claim 10, wherein the pixel bias circuit comprises:
a first transistor having a gate, a drain and a source, the source of the first transistor being coupled to a reference voltage supply, and the gate of the first transistor being configured to receive a bias voltage signal; and
a second transistor having a gate, a drain and a source, the source of the second transistor being coupled to the drain of the first transistor, the gate of the second transistor being coupled to the control circuit and configured to receive the third enable signal, and the drain of the second transistor being coupled to at least an input of the amplifier.

12. The integrated circuit of claim 11, wherein the first transistor and the second transistor are configured to set the first analog pixel output signal in response to the third enable signal and the bias voltage signal.

13. The integrated circuit of claim 11, wherein the control circuit comprises:
a first NAND gate comprising a first input terminal, a second input terminal and a first output terminal,
the first input terminal of the first NAND gate being coupled to at least the comparator and configured to receive the comparator output signal,
the second input terminal of the first NAND gate being configured to receive the control signal, and
the first output terminal of the first NAND gate being coupled to the comparator and configured to generate the first enable signal in response to the comparator output signal and the control signal.

14. The integrated circuit of claim 13, wherein the control circuit further comprises:
a second NAND gate comprising a first input terminal, a second input terminal and a first output terminal,
the first input terminal of the second NAND gate being coupled to the comparator and the first input terminal of the first NAND gate and configured to receive the comparator output signal,
the second input terminal of the second NAND gate being coupled to the second input terminal of the first NAND gate and configured to receive the control signal, and
the first output terminal of the second NAND gate being coupled to the gate of the second transistor and configured to generate the third enable signal in response to the comparator output signal and the control signal.

15. The integrated circuit of claim 14, wherein the control circuit further comprises:
a third NAND gate comprising a first input terminal, a second input terminal and a first output terminal,
the first input terminal of the third NAND gate being coupled to the comparator, the first input terminal of the first NAND gate and the first input terminal of the second NAND gate and configured to receive the comparator output signal,
the second input terminal of the third NAND gate being coupled to the second input terminal of the first NAND gate, the second input terminal of the second NAND gate and configured to receive the control signal, and
the first output terminal of the third NAND gate being coupled to the amplifier and configured to generate the second enable signal in response to the comparator output signal and the control signal.

16. A method of operating an analog-to-digital converter circuit, the method comprising:
receiving, by a comparator, a first pixel output signal;
comparing, by the comparator, a reference signal with the first pixel output signal thereby generating a comparator output signal; and
enabling or disabling, by a controller, the comparator by a first enable signal, the first enable signal being generated in response to at least the comparator output signal, the controller being coupled to the comparator.

17. The method of claim 16, further comprising:
enabling or disabling, by the controller, a pixel bias circuit in response to a second enable signal, the pixel bias circuit being coupled to a pixel circuit.

18. The method of claim 17, further comprising:
enabling or disabling, by the controller, an amplifier in response to a third enable signal, the amplifier being coupled to the pixel circuit and the comparator.

19. The method of claim 18, further comprising:
performing a first NAND logic operation of a control signal and the comparator output signal thereby generating the first enable signal.

20. The method of claim 19, further comprising:
performing a second NAND logic operation of the control signal and the comparator output signal thereby generating the second enable signal; and
performing a third NAND logic operation of the control signal and the comparator output signal thereby generating the third enable signal.

* * * * *